(12) United States Patent
Harshbarger et al.

(10) Patent No.: US 10,400,722 B2
(45) Date of Patent: Sep. 3, 2019

(54) PULSE INTERRUPT CONTROL MODE FOR CONFIGURABLE OUTPUT DRIVER ASIC

(71) Applicant: CUMMINS INC., Columbus, IN (US)

(72) Inventors: Daniel R. Harshbarger, Columbus, IN (US); Meenal Rajiv Vaidya, Greenwood, IN (US); Fei Gong, Columbus, IN (US)

(73) Assignee: Cummins Inc., Columbus, IN (US)

( * ) Notice: Subject to any disclaimer, the term of this patent is extended or adjusted under 35 U.S.C. 154(b) by 41 days.

(21) Appl. No.: 15/855,374

(22) Filed: Dec. 27, 2017

(65) Prior Publication Data

US 2018/0180002 A1 Jun. 28, 2018

Related U.S. Application Data

(60) Provisional application No. 62/439,713, filed on Dec. 28, 2016.

(51) Int. Cl.
| | |
|---|---|
| *F02M 51/06* | (2006.01) |
| *H02P 27/04* | (2016.01) |
| *H03K 17/687* | (2006.01) |
| *F02D 41/20* | (2006.01) |
| *H03K 17/16* | (2006.01) |
| *F02D 41/26* | (2006.01) |
| *F02D 41/22* | (2006.01) |

(52) U.S. Cl.
CPC ............. *F02M 51/06* (2013.01); *F02D 41/20* (2013.01); *F02D 41/266* (2013.01); *H02P 27/04* (2013.01); *H03K 17/166* (2013.01); *H03K 17/6871* (2013.01); *F02D 41/22* (2013.01); *F02D 2041/2086* (2013.01)

(58) Field of Classification Search
CPC ....... F02M 51/06; F02D 41/266; F02D 41/20; F02D 2041/2086; F02D 41/22; H03K 17/166; H03K 17/6871; H02P 27/04
See application file for complete search history.

(56) References Cited

U.S. PATENT DOCUMENTS

| | | | | |
|---|---|---|---|---|
| 4,173,030 | A | | 10/1979 | Rabe |
| 5,444,590 | A | * | 8/1995 | LeComte ............... H02H 3/093 361/18 |
| 5,678,521 | A | * | 10/1997 | Thompson ............. F02M 63/00 123/446 |
| 5,723,915 | A | * | 3/1998 | Maher .................... H02H 3/093 307/131 |
| 7,979,194 | B2 | | 7/2011 | Wilhelm et al. |
| 8,161,946 | B2 | | 4/2012 | Pursifull |
| 8,239,119 | B2 | | 8/2012 | Bagnasco et al. |
| 8,364,380 | B2 | | 1/2013 | Rayl et al. |
| 2004/0085033 | A1 | * | 5/2004 | Bliley ...................... H02P 5/68 318/106 |

(Continued)

FOREIGN PATENT DOCUMENTS

EP         1469574 A1 * 10/2004 ........... H02H 11/003

*Primary Examiner* — Joseph J Dallo
(74) *Attorney, Agent, or Firm* — Faegre Baker Daniels LLP

(57) ABSTRACT

A method includes receiving a plurality of injection pulses; generating a plurality of drive signals in response to the plurality of injection pulses; generating an interrupt signal in response to the plurality injection pulses, the interrupt signal being one of a high interrupt signal and a low interrupt signal; and transitioning between a plurality of operating states in response to the interrupt signal.

21 Claims, 19 Drawing Sheets

(56) References Cited

U.S. PATENT DOCUMENTS

2006/0016435 A1* 1/2006 Kirkpatrick ............ F02D 41/20
                                                              123/490
2012/0080536 A1    4/2012 Parrish et al.

* cited by examiner

Mode 1, with interruption for ready and Pull-in State Transactions

PULSE INTERRUPT CONTROL MODE FOR CONFIGURABLE OUTPUT DRIVER ASIC

CROSS-REFERENCE TO RELATED APPLICATIONS

The present application claims priority to U.S. provisional application No. 62/439,713, filed Dec. 28, 2016, titled "PULSE INTERRUPT CONTROL MODE FOR CONFIGURABLE OUTPUT DRIVER ASIC," the entire disclosure of which being expressly incorporated herein by reference.

TECHNICAL FIELD

The present disclosure relates generally to a push-pull driver control module for injector pre-drivers. More specifically, a pulse-interrupt control module for the injector pre-drivers provided with dead-time control and interlock fault handling features implemented in a control logic block of application specific integrated circuits (ASICs).

BACKGROUND

Currently, for injector driver applications, in order to control the time of injection phases, either a dedicated input pin is needed for each phase, or a combination of pre-set fixed timing registers and internal timers is used. Conventional implementations do not permit use of a single input to accurately control time on more than two different phases. Approaches using a dedicated input pin (signal) could have accurate timing control on the fly. However, such approaches need additional pins for each phase transition. For example, in order to control the time for the pre-peak, boost-pull-in, and pull-in phases, three dedicated pins are needed. This means more pins in the ASIC, more control pins in the microcontroller, more board traces, and thus increased system cost. The approaches that use a combination of (a group of) pre-set fixed timing registers and internal timers could also control the time for the phases. Each phase needs at least one register to set the desired time. However, the register cannot be changed on the fly. Thus, if there is a timing change during the injection, the change is not applied in real time in the current injection pulse.

Thus, there remains a need in the art for an implementation of an interrupt control scheme into the fuel system pre-driver so that the timing for all different injection phases can be accurately controlled within the same injection cycle through only one pin in the pre-driver ASIC.

SUMMARY

According to one embodiment, the present disclosure provides a circuit, comprising: a high-side switch receiving a source voltage; a low-side switch; and an application specific integrated circuit (ASIC) connected to the high-side switch and the low-side switch; wherein the ASIC controls the switches to cause current to flow through a load comprising a fuel injector, thereby controlling timing of a plurality of injection phases of the fuel injector using only one pin of the ASIC. In one aspect of this embodiment, each of the switches is metal-oxide-semiconductor (MOS). In another aspect, the ASIC includes a high-side diagnostic sensor connected in parallel across the high-side switch, the high-side diagnostic sensor being configured to diagnose a fault in the high-side switch. In another aspect, the ASIC includes a low-side diagnostic sensor configured to sense a fault across the low-side switch. Yet another aspect further includes a sensor connected between ground and the low-side switch, the sensor being configured to sense a current flowing through the load. Still another aspect further includes a third switch connected between a high side of the load and ground, the third switch being configured to cause current to flow through the load when the high-side switch is off.

In another embodiment of the present disclosure, a circuit is provided, comprising: a high-side switch receiving a source voltage; a low-side switch; a booster switch receiving a booster voltage; an application specific integrated circuit (ASIC) connected to the high-side switch, the low-side switch and the booster switch; wherein the ASIC controls the switches to cause current to flow through a load comprising a fuel injector, thereby controlling timing of a plurality of injection phases of the fuel injector using only one pin of the ASIC. In one aspect of this embodiment, the circuit further includes a pre-driver connected between the ASIC and the booster switch, the pre-driver being configured to provide high voltage to the booster switch. In another aspect, each of the switches is metal-oxide-semiconductor (MOS). In yet another aspect, the ASIC includes a high-side diagnostic sensor connected in parallel across the high-side switch, the high-side diagnostic sensor being configured to diagnose a fault in the high-side switch. In another aspect, the ASIC includes a low-side diagnostic sensor configured to sense a fault across the low-side switch. In still another aspect of this embodiment, the circuit further includes a sensor connected between ground and the low-side switch, the sensor being configured to sense a current flowing through the load. Another aspect further includes a third switch connected between a high side of the load and ground, the third switch being configured to cause current to flow through the load when the high-side switch is off.

In yet another embodiment, the present disclosure provides a system, comprising: a control logic module having an output that provides an injection timing signal; and a programmable load driver module coupled to the control logic module, the programmable load driver module having an input that receives the injection timing signal and being configured to generate an interrupt signal in real time in response to the injection timing signal; wherein the programmable load driver module provides the interrupt signal to a load to transition the load between a plurality of operating states. In one aspect of this embodiment, the programmable load driver module comprises: a high-side switch receiving a source voltage; a low-side switch; and an application-specific integrated circuit (ASIC) connected to the high-side switch and the low-side switch; wherein the ASIC control the switches to cause current to flow through the load. In another aspect, the programmable load driver module comprises: a high-side switch receiving a source voltage; a low-side switch; a booster switch receiving a booster voltage; an application specific integrated circuit (ASIC) connected to the high-side switch, the low-side switch, and the booster switch; wherein the ASIC control the switches to cause current to flow through the load.

In still another embodiment, the present disclosure provides a method, comprising: receiving a plurality of injection pulses; generating a plurality of drive signals in response to the plurality of injection pulses; generating an interrupt signal in response to the plurality injection pulses, the interrupt signal being one of a high interrupt signal and a low interrupt signal; and transitioning between a plurality of operating states in response to the interrupt signal. In one aspect of this embodiment, the interrupt signal has priority over a timer of the plurality of operating states. Another aspect of this embodiment further comprises operating an application-specific integrated circuit (ASIC) in response to a low signal at a enable signal input such that a first idle event occurs in which the ASIC is idle; operating the ASIC in response to a high signal at the enable signal input and a low interrupt signal such that a ready state occurs; transitioning from the ready state in response to a high interrupt signal and a high signal at the enable signal to cause a pre-peak state to occur; transitioning from the ready state in response to a first timer signal and a high signal at the enable signal input to cause a ramp state to occur; transitioning from the pre-peak state in response to a low signal at the interrupt signal and a high signal at the enable signal input to cause the ramp state to occur; transitioning from the ramp state in response to a second timer signal and a high signal at the enable signal input to cause a booster pull-in state to occur; transitioning from the ramp state in response to a load reaching a pull-in-peak current and a high interrupt signal to cause a pull-in state to occur; transitioning from the booster pull-in state in response to a third timer signal and a high signal at the enable signal input to cause a hold state to occur; transitioning from the booster pull-in state in response to a high interrupt signal and a high signal at the enable signal input; transitioning from the pull-in state in response to a low interrupt signal and a high signal at the enable signal input; and transitioning from the hold state in response to a low signal at the enable signal input to cause the ASIC to enter an idle state. Another aspect further comprises operating an application-specific integrated circuit (ASIC) in response to a low signal at a enable signal input such that a first idle event occurs in which the ASIC is idle; operating the ASIC in response to a high signal at the enable signal input and a low interrupt signal such that a ready state occurs; transitioning from the ready state in response to a high interrupt signal and a high signal at the enable signal to cause a pre-peak state to occur; transitioning from the ready state in response to a first timer signal, a high signal at the enable signal input, and a low interrupt signal to cause a ramp state to occur; transitioning from the pre-peak state in response to a low interrupt signal and a high signal at the enable signal input to cause the ramp state to occur; transitioning from the ramp state in response to a high signal at the enable signal input and a high interrupt signal to cause a pull-in state to occur; transitioning from the ramp state in response to a second timer signal, a high signal to the enable signal input, and a low interrupt signal to cause a hold state to occur; transitioning from the pull-in state in response to a low interrupt signal and a high signal at the enable signal input; and transitioning from the hold state in response to a low signal at the enable signal input to cause the ASIC to enter an idle state. Yet another aspect of this embodiment further comprises producing a fault signal in response to a diagnostic signal at one of a high-side switch, a low-side switch, and a current sensor.

While multiple embodiments are disclosed, still other embodiments of the present disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

The above-mentioned and other features of this disclosure and the manner of obtaining them will become more apparent and the disclosure itself will be better understood by reference to the following description of embodiments of the present disclosure taken in conjunction with the accompanying drawings, wherein.

DETAILED DESCRIPTION

One of ordinary skill in the art will realize that the embodiments provided can be implemented in hardware, software, firmware, and/or a combination thereof. Programming code according to the embodiments can be implemented in any viable programming language such as C, C++, HTML, XTML, JAVA or any other viable high-level programming language, or a combination of a high-level programming language and a lower level programming language.

As used herein, the modifier "about" used in connection with a quantity is inclusive of the stated value and has the meaning dictated by the context (for example, it includes at least the degree of error associated with the measurement of the particular quantity). When used in the context of a range, the modifier "about" should also be considered as disclosing the range defined by the absolute values of the two endpoints. For example, the range "from about 2 to about 4" also discloses the range "from 2 to 4."

The present disclosure provides a modified injector pre-driver mode with a pulse interruption control mode, which when implemented in the ASIC allows the immediate timing control for different injection phases, included the pre-peak, boost-pull-in and pull-in stages. The present disclosure permits implementation of the control with reduced pins and can be used in fuel system applications. As is further described below, the present disclosure uses a single interrupt control signal to terminate the current-state (phase) of injection cycle. Thus the timing of the affected injection phase can be accurately controlled in real time. The interruption action may be effective at either a rising edge or a falling edge of the interrupt signal (pulse), or either a high level or a low level of the signal (level). One interrupt control signal, when combined with the state machine, can precisely interrupt the time control of different phases at different times. One embodiment uses pulse interruption. Another embodiment uses level interruption which is the combination of level trigger and edge trigger. In this embodiment, the interrupt control signal not only controls the time length of the injection phase, but can also be used to skip certain phases among different injection cycles.

Figure 1:
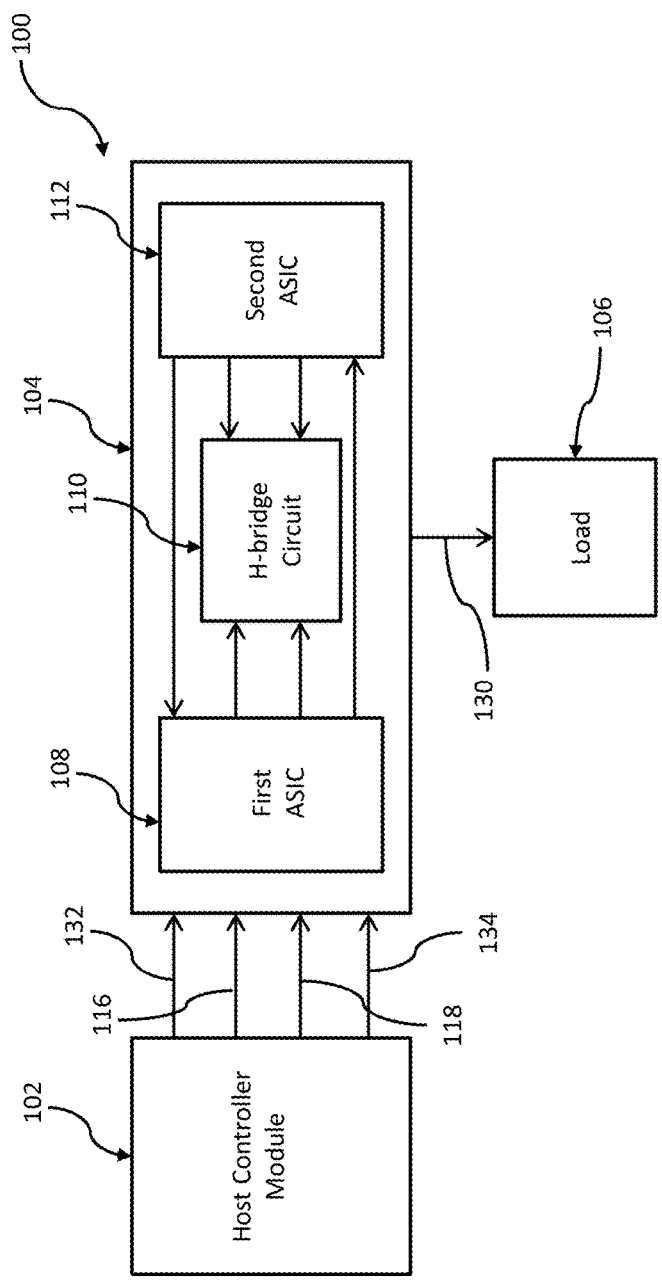
FIG. 1 is a block diagram of an exemplary system in which a programmable load driver module including an H-bridge circuit can be implemented according to present disclosure.

Referring now to FIG. 1, a system 100 is depicted as including a host controller module 102, a programmable load driver module 104, and a load 106. Host controller module 102 generally includes a microcontroller unit (not shown) configured to send control signals to the programmable load driver module 104. The microcontroller unit generally may include a processor, a memory, and peripherals. The microcontroller unit may be programmable or non-programmable. The host controller module 102 provides a plurality of pulse width modulation signals ("PWM") 116, and enable signals 118 to programmable load driver module 104 to drive a certain target load 106. Host controller module 102 may drive a plurality of programmable load drivers 104 or other drivers (not shown) together in parallel or series. Host controller module 102 may be a general purpose computer device having a memory, a microprocessor, and a control processing unit.

Generally, load 106 may be any load which operates on electricity. More specifically, load 106 is a load device within a combustion engine, for example, a fuel injector, an after treatment driver, a turbocharger, an injector driver, an actuator driver, an exhaust throttle, a DC motor, or an intake throttle. Load 106 is coupled to programmable load driver module 104 which provides driving signals 130 to load 106. Programmable load driver module 104 may drive one load 106 or multiple loads (not shown) together in parallel or series.

Still referring to FIG. 1, programmable load driver module 104 generally includes a first ASIC 108, a second ASIC 112, and an H-bridge circuit 110. Programmable load driver module 104 may be installed inside an engine control module ("ECM") (not shown) of an internal combustion engine (not shown). Programmable load driver module 104 is configured to process the input enable 118 and PWM 116 signals according to programmable logic and produce control signals 130 to drive load 106 as is further described below. First ASIC 108 and second ASIC 112 may have similar configurations or different configurations. Only one channel of each of first ASIC 108 and second ASIC 112 is configured to operate in the manner described herein. Therefore, other channels of each of first ASIC 108 and second ASIC 112 may be used to control other circuits or devices or may remain unused. First ASIC 108 and second ASIC 112 may be configurable output driver ASICs having a total of four channels each.

Figure 2:
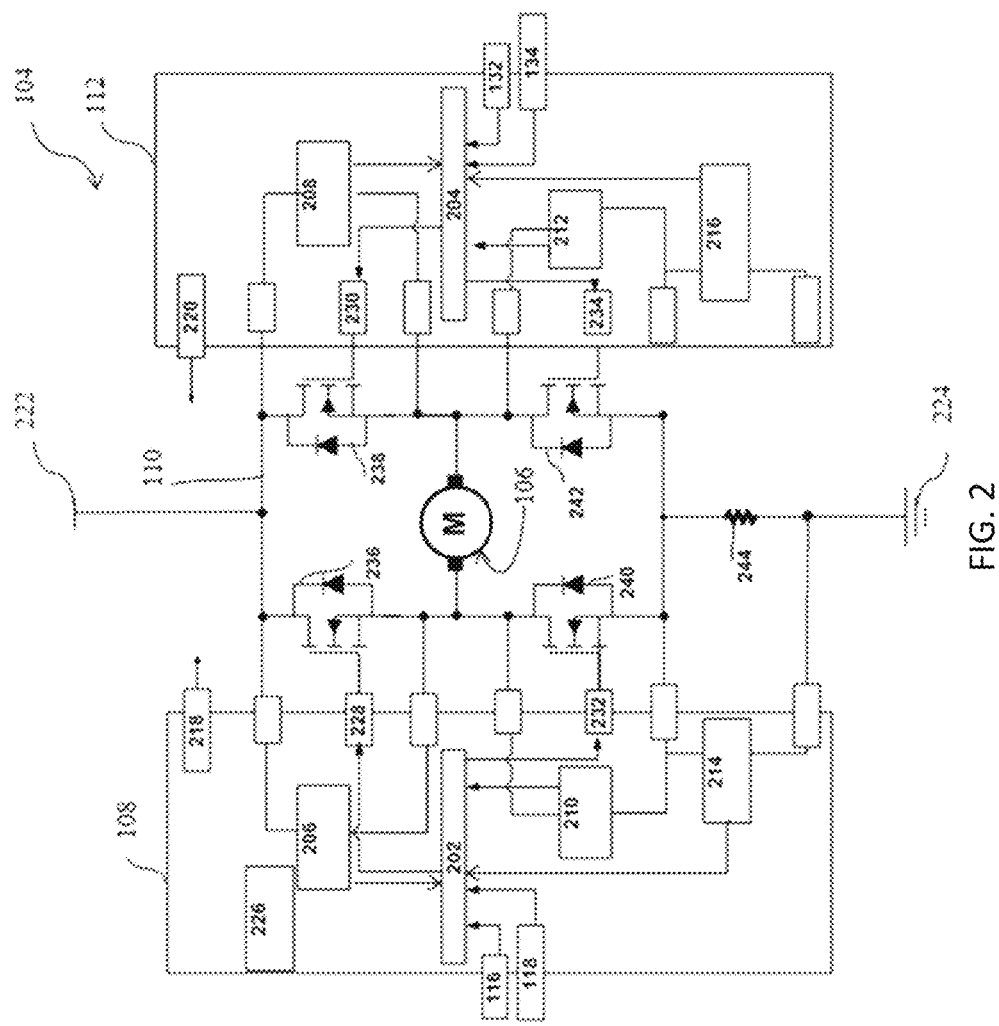
FIGS. 2 and 3 are schematic diagrams of an exemplary programmable load driver module of the system of FIG. 1.
Figure 3:
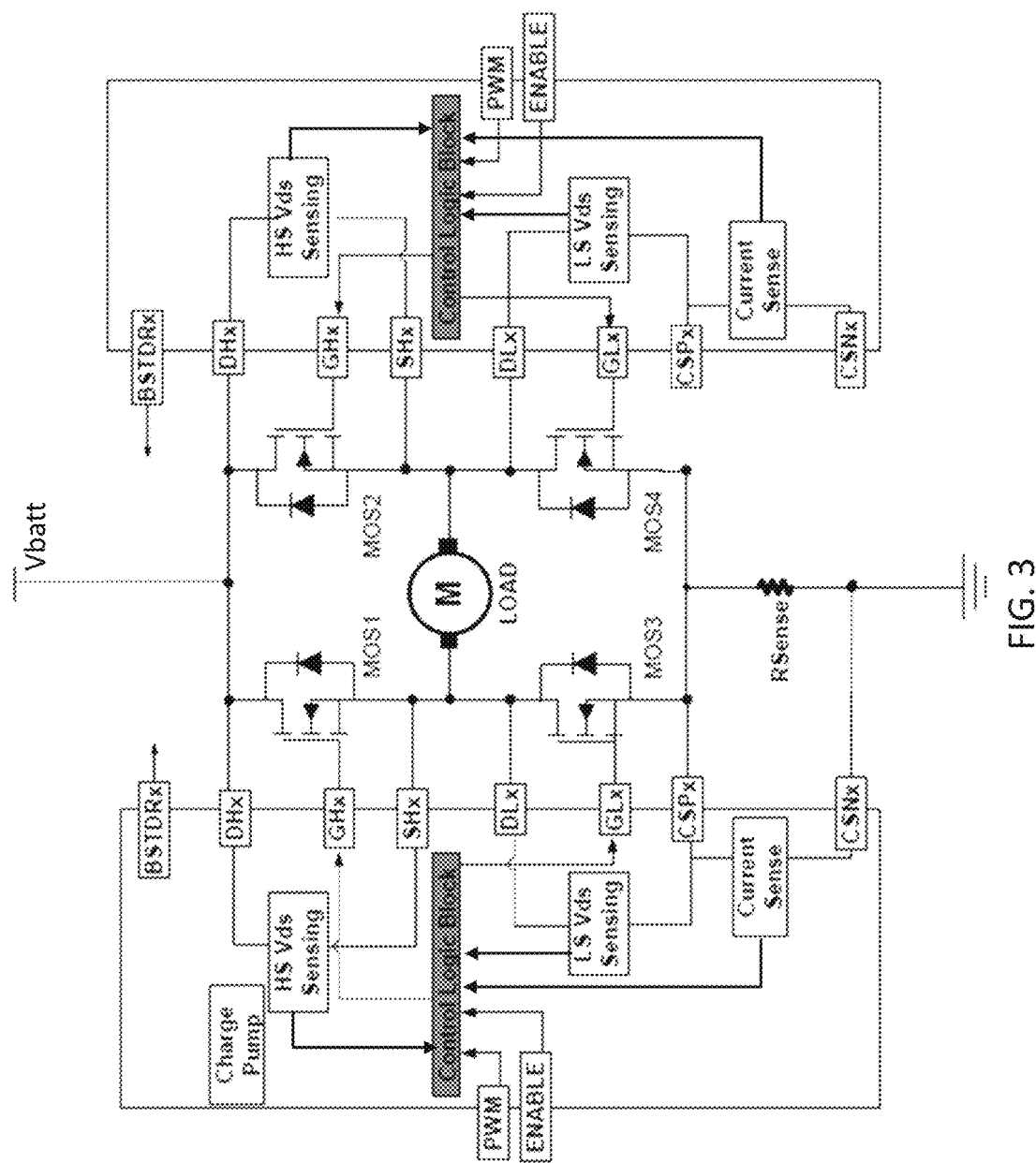

Referring now to FIGS. 2 and 3, programmable load driver module 104 is depicted as including first ASIC 108, second ASIC 112, H-bridge circuit 110, a voltage source 222, and a ground connection 224. FIG. 3 is the same as FIG. 2 except the components and signals are named rather than numbered. H-bridge circuit 110 further includes four switches: a first high-side switch 236, a second high-side switch 238, a first low-side switch 240, and a second low-side switch 242. First high-side switch 236 and second high-side switch 238 are connected at the high-side of H-bridge circuit 110, whereas first low-side switch 240 and second low-side switch 242 are connected at a low-side of H-bridge circuit 110. First high-side switch 236 and second high-side switch 238 are further connected to voltage source 222, and first low-side switch 240 and second low-side switch 242 are both connected to ground connection 224. Furthermore, first ASIC 108 is connected to first high-side switch 236 and first low-side switch 240. Similarly, second ASIC 112 is connected to second high-side switch 238 and second low-side switch 242. Load 106 is connected at a junction between the two high-side switches and the two low-side switches of H-bridge circuit 110. The two high-side switches and low-side switches may be metal-oxide-semiconductors ("MOS"). Additionally, the two high-side switches and two low-side switches may be any type of power transistors, for example, metal oxide semiconductor field effect transistors ("MOSFET"), graphene base transistors ("GBT"), or bipolar transistors. Programmable load driver module 104 may also include a resistor 244 connected between ground connection 224 and a middle junction of the two low-side switches.

Still referring to FIGS. 2 and 3, first ASIC 108 includes a first control logic block 202, a first high-side diagnostic sensor 206, a first low-side diagnostic sensor 210, a first synchronization signal 218, and a first sensor 214. First control logic block 202 receives a plurality of input signals including: first PWM 116, a first low-side diagnostic sensor signal, a first high-side diagnostic sensor signal, an output signal from first sensor 214, and first enable signal 118. For example, only one pin of first ASIC 108 carrying first enable signal 118 is used to control timing of one or more injection phases of load 106 (e.g., fuel injector). In another example, as with first ASIC 108, only one pin of second ASIC 112 carrying a second enable signal 134 is used to control timing of one or more injection phases of load 106. First control logic block 202 also sends a plurality of output signals: first high-side gate 228 ("GH1"), first low-side gate 232 ("GL1"), and a first synchronization signal 218. First control logic block 202 may be a programmable or non-programmable logic block. GH1 228 is connected to a gate of first high-side switch 236, and GL1 232 is connected to a gate of the first low-side switch 240. First high-side diagnostic sensor 206 is connected across first high-side switch 236, and first low-side diagnostic sensor 210 is connected across first low-side switch 240. First high-side diagnostic sensor 206 and first low-side diagnostic sensor 210 may be any type of sensor capable of sensing voltage, current, voltage difference, or of diagnosing faults across the corresponding switch.

Second ASIC 112 includes a second control logic block 204, a second high-side diagnostic sensor 208, a second low-side diagnostic sensor 212, a second synchronization signal 220, and a second current sensor 216. Second control logic block 204 receives a plurality of input signals including: second PWM 132, a second low-side diagnostic sensor signal, a second high-side diagnostic sensor signal, an output signal from second sensor 216, and second enable signal 134. Second control logic block 204 also produces a plurality of output signals including second high-side gate ("GH2") 230, second low-side gate ("GL2") 234, and second synchronization signal 220. Second control logic block 204 may be a programmable or non-programmable logic block. GH2 230 is connected to a gate of second high-side switch 238 and GL2 234 is connected to a gate of second low-side switch 242. Second high-side diagnostic sensor 208 is connected across second high-side switch 238 and second low-side diagnostic sensor 212 is connected across second low-side switch 242. Second high-side diagnostic sensor 208 and second low-side diagnostic sensor 212 may be any type of sensor capable of sensing voltage, current, voltage difference, or of diagnosing faults across the corresponding switch. One having the ordinary skill in the art with the benefit of the present disclosure will realize that the first high-side diagnostic sensor 206, first low-side diagnostic sensor 210, second high-side diagnostic sensor 208, and second low-side diagnostic sensor 212 can be connected to the corresponding switches in various ways for sensing voltage, current, voltage difference, or for diagnosing faults. First synchronization signal 218 is coupled to second enable signal 134 and second synchronization signal 220 is coupled to first enable signal 118 to synchronize first ASIC 108 with second ASIC 112.

Figure 4:
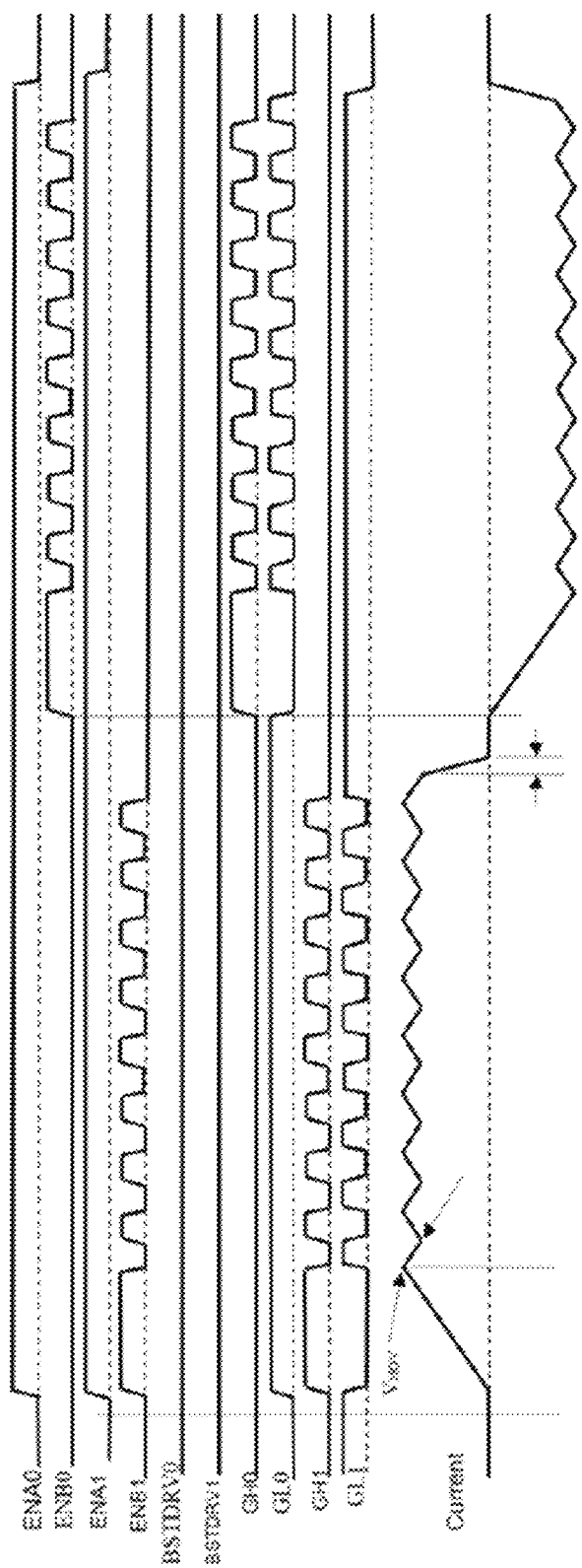
FIG. 4 is a timing diagram depicting operation of the load driver module of FIG. 1.

In one embodiment of the present disclosure, sensors 214 and 216 may be placed outside first ASIC 108 and second ASIC 112, respectively. In yet another embodiment of the present disclosure, one or both sensors 214 and 216 may be connected to a current amplifier (not shown) configured to amplify current. Sensors 214 and 216 may be configured to regulate current. In another embodiment of the present disclosure, first ASIC 108 or second ASIC 112 may include a charge pump 226, bootstrap (e.g., Pre-Driver shown in FIG. 18), or any other device configured to provide a positive voltage to the corresponding high-side switch. FIG. 4 is a waveform diagram depicting the typical operation of system 100. For example, enable signals ENA0, ENB0, ENA1, ENB1 are input control signals. Boost drive signals BSTDRV0, BSTDRV1, high-side gate signals GH0, GH1, and low-side gate signals GL0, GL1 are output control signals for driving MOS1-MOS4 shown in FIG. 3. In one example, the enable signals ENB0 and ENB1 can be used as interrupt signals.

Figure 5:
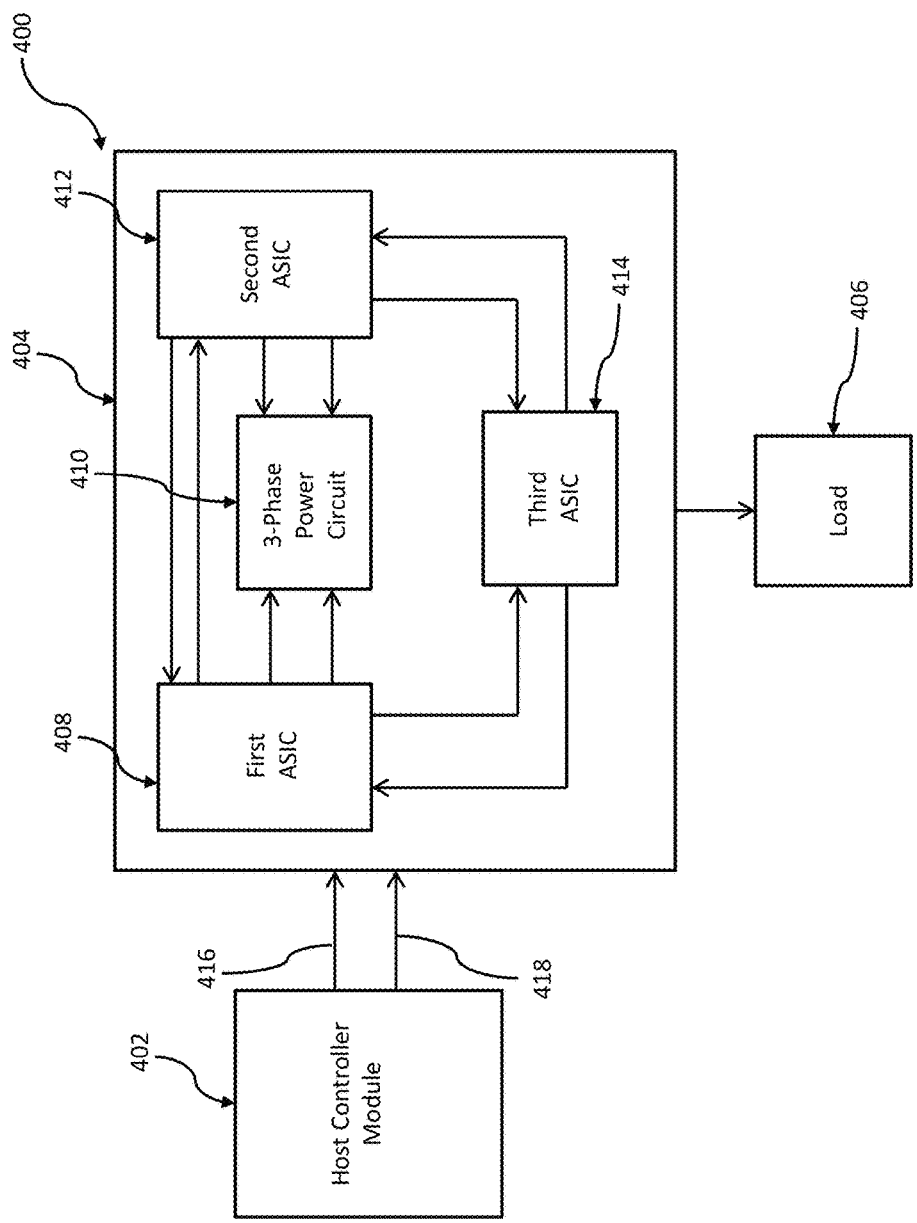
FIG. 5 is a block diagram of an exemplary system in which a programmable three-phase load driver module is implemented according to present disclosure.

Referring now to FIG. 5, a system 400 is depicted as including a host controller module 402, a programmable 3-phase load driver module 404, and a load 406. Host controller module 402 generally includes a microcontroller unit (not shown) configured to send control signals 416 to the programmable 3-phase load driver module 404. The microcontroller unit may include similar characteristics as discussed above with reference to FIG. 1. Host controller module 402 provides a plurality of PWM signals and a plurality of enable signals (discussed later) to programmable 3-phase load driver module 404 to drive a certain target load 406. Host controller module 402 may drive other programmable or non-programmable load drivers in parallel or in series with programmable 3-phase load driver module 404.

Generally, load 406 may be a load which operates on electricity. More specifically, load 406 is a 3-phase winding circuitry load. Load 406 may be a 3-phase brushless DC motor or a brushed motor (not shown). The DC motor may a wye-winding or a delta winding style DC motor. Load 406 may include similar characteristics as discussed above with reference to FIG. 1. Load 406 is coupled to the 3-phase programmable load driver module 404 which provides driving signals to load 406.

Still referring to FIG. 5, programmable 3-phase load driver module 404 generally includes a first ASIC 408, a second ASIC 412, a third ASIC 414, and a 3-phase power circuit 410. Programmable 3-phase load driver module 404 may be installed inside an ECM (not shown) of an internal combustion engine (not shown). First ASIC 408, second ASIC 412, and third ASIC 414 may have similar configurations or different configurations. One channel of each of first ASIC 408, second ASIC 412, and third ASIC 414 is configured to operate in the manner described herein. Therefore, other channels of each of first ASIC 408, second ASIC 412, and third ASIC 414 may be used to control or drive other circuits or may remain unused. First ASIC 408, second ASIC 412, and third ASIC 414 may be configurable output driver ASICs having a total of four channels each.

Figure 6:
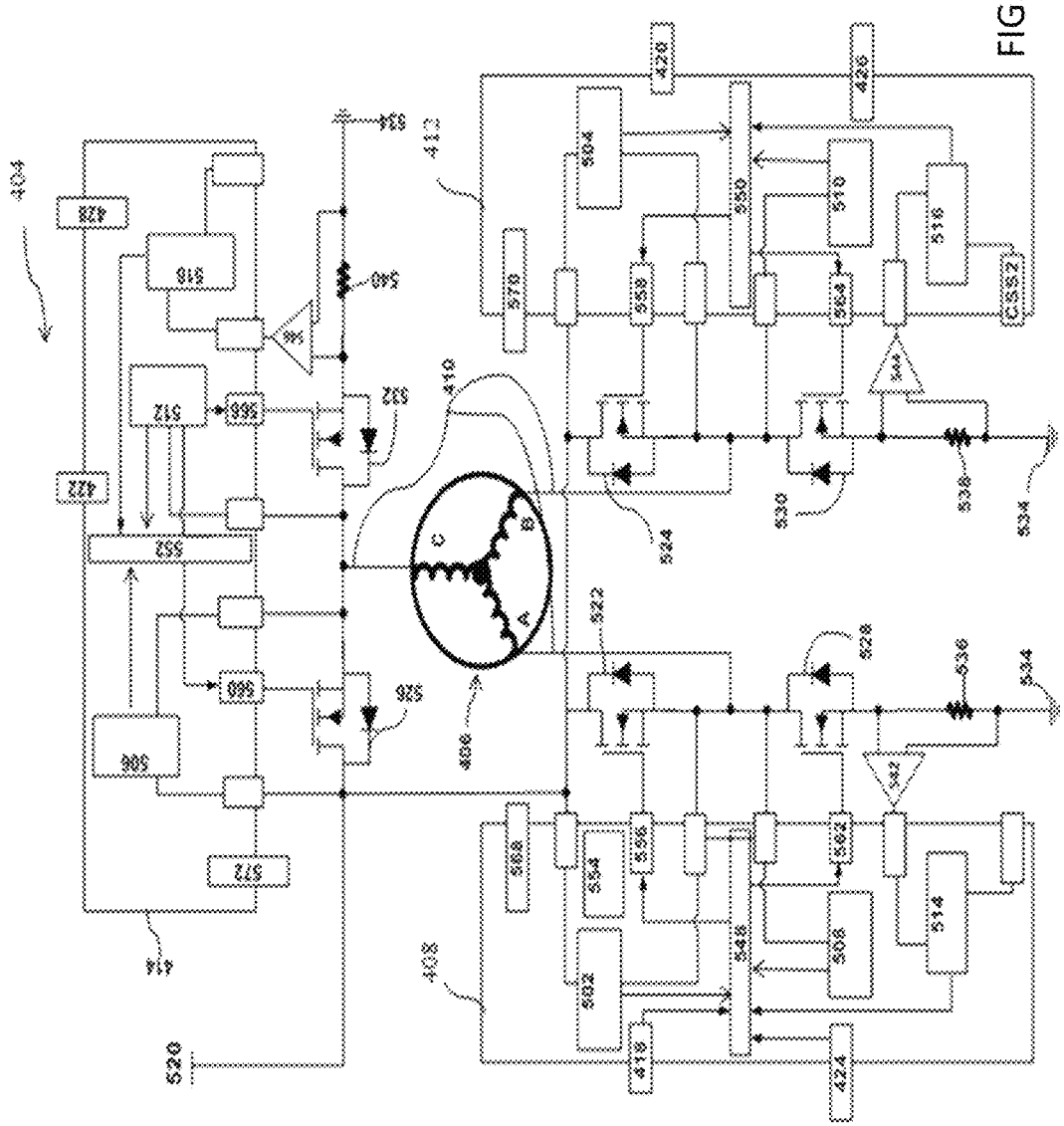
FIGS. 6 and 7 are schematic diagrams of an exemplary programmable 3-phase load driver module of the system of FIG. 5.
Figure 7:
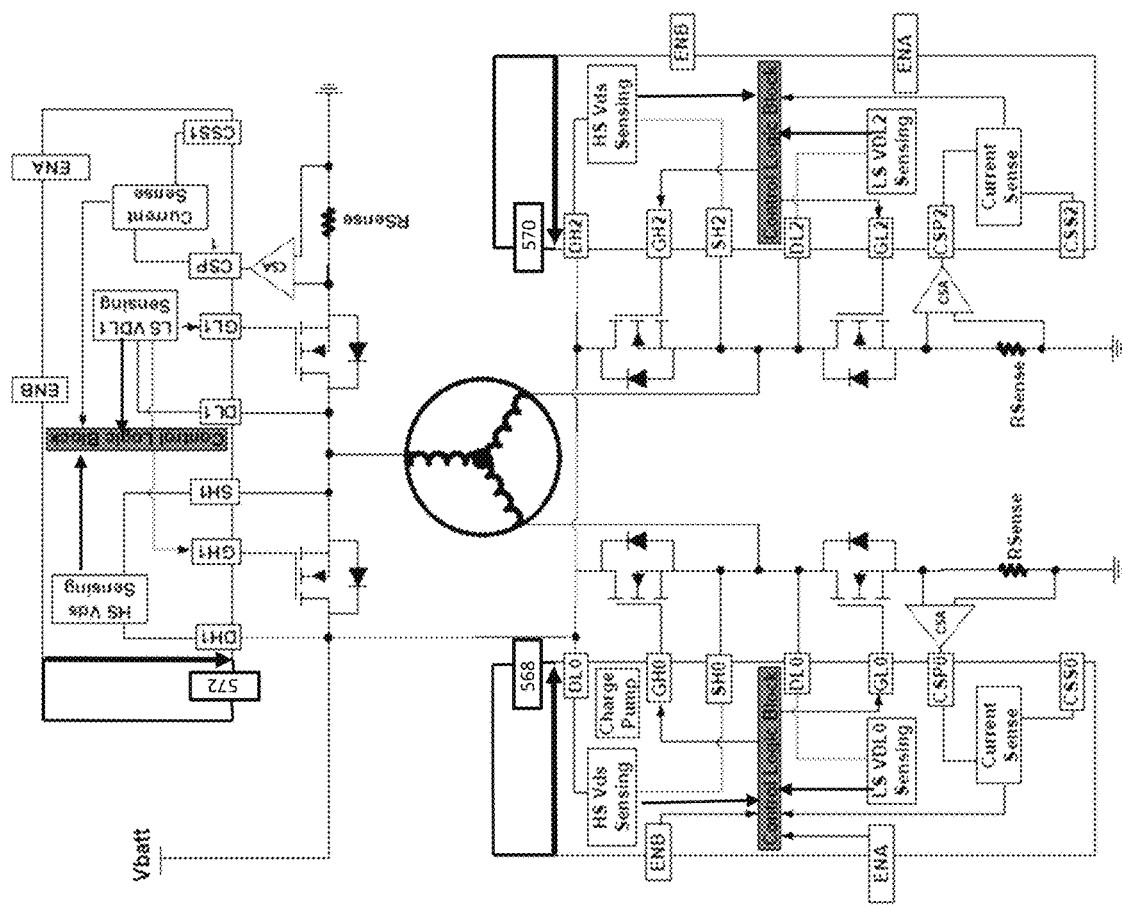

Referring now to FIGS. 6 and 7, the 3-phase programmable load driver module 404 is depicted as including first ASIC 408, a second ASIC 412, third ASIC 414, a 3-phase power circuit 410, a first high-side diagnostic sensor 502, a second high-side diagnostic sensor 504, a third high-side diagnostic sensor 506, a first low-side diagnostic sensor 508, a second low-side diagnostic sensor 510, a third low-side diagnostic sensor 512, a ground connection 534, and a voltage source 520. FIG. 7 is the same as FIG. 6 except the components and signals are named rather than numbered. First high-side switch 522, a second high-side switch 524, a third high-side switch 526, and a first low-side switch 528, a second low-side switch 530, a third low-side switch 532 form a 3-phase power circuit 410 connected across a voltage source 520. First high-side switch 522 and first low-side switch 528 form one bridge wherein first high-side switch 522 is connected to high voltage source 520 and first low-side switch 528 is connected to ground connection 534. Similarly, second high-side switch 524 and second low-side switch 530 form one bridge where second high-side switch 524 is connected to voltage source 520 and second low-side switch 530 is connected to ground connection 534. Third high-side switch 526 and third low-side switch 532 form one bridge wherein third high-side switch 526 is connected to voltage source 520 and third low-side switch 532 is connected to ground connection 534.

First ASIC 408 is connected to first high-side switch 522 and first low-side switch 528. Second ASIC 412 is connected to second high-side switch 522 and second low-side switch 530. Similarly, third ASIC 414 is connected to third high-side switch 526 and third low-side switch 532. The three high-side switches and three low-side switches may have similar characteristic as discussed above in reference with FIG. 2. Three-phase programmable load driver module 404 may include a first resistor 536, a second resistor 538, and a third resistor 540. One end of each of resistors 536, 538, 540 is connected to a corresponding low-side switch and the other end is connected to ground connection 534. Additionally, the inputs to first amplifier 542, second amplifier 544, and third amplifier 546 are connected across the corresponding first resistor 536, second resistor 538, and third resistor 540, respectively (as shown). Each amplifier 542, 544, and 546 may be placed inside of first ASIC 408, second ASIC 412, and third ASIC 414, respectively (not shown) or may be placed outside each of the corresponding ASICs (as shown). First sensor 514, second sensor 516, and third sensor 518 are configured to sense current in 3-phase power circuit 410. Each sensor 514, 516 and 518 may be inside first ASIC 408, second ASIC 412, and third ASIC 414, respectively (as shown) or may be placed outside each of the corresponding ASICs (not shown). First ASIC 408, second ASIC 412, and third ASIC 414 may also include a charge pump (not shown), bootstrap (e.g., Pre-Driver shown in FIG. 18), or any other device configured to provide a positive voltage to the high-side switch of the corresponding ASIC.

Still referring to FIGS. 6 and 7, first ASIC 408 includes a first control logic block 548, second ASIC 412 includes a second control logic block 550, and third ASIC 414 includes a third control logic block 552. Generally, each of the plurality of control logic blocks are configured to receive control signals from host controller module 402 (not shown), and send control and driving signals to each of the corresponding switches of 3-phase circuit 410 to drive load 406. Each of the control logic blocks may be programmable or non-programmable. First control logic block 548 sends a plurality of output signals: an output signal to first high-side gate (GH0) 556, an output signal to first low-side gate output (GL0) 562, and a first synchronization signal 568. Additionally, first control logic block 548 receives a plurality of input signals including: a first high-side diagnostic sensor signal, a first low-side diagnostic sensor signal, a first enable signal 424, an output signal from first sensor 514, and an output signal from first PWM 418. First high-side diagnostic sensor 502 is connected across first high-side switch 522 and is configured to sense voltage, current, a voltage difference, or diagnostic faults across the corresponding switch. Similarly, first low-side diagnostic sensor 508 is connected across first low-side switch 528 and is configured to sense voltage, current, a voltage difference, or diagnostic faults across the corresponding switch.

Similar to first control logic block 548, second control logic block 550 produces a plurality of signals: an output signal to second high-side gate (GH2) 558, an output signal to second low-side gate (GL2) 564, and a second synchronization signal 570. Furthermore, second control logic block 550 receives a plurality of input signals including: a second high-side diagnostic sensor 504 signal, a second low-side diagnostic sensor 510 signal, an output signal from second sensor 516, an output signal from second PWM 420, and a second enable signal 426. Each of plurality of deadtimes may be programmable or non-programmable. Second high-side sensor 504 is connected across second high-side switch 524, and is configured to sense voltage, current, voltage difference, or diagnostic faults across the corresponding switch. Similarly, second low-side sensor 510 is connected across second low-side switch 530 and is configured to sense voltage, current, voltage difference, or diagnostic faults across the corresponding switch.

Similar to first control logic block 548 and second control logic block 550, third control logic block 552 also sends a plurality of signals: an output signal to third high-side gate (GH1) 560, an output signal to third low-side gate (GL1) 566, and a third synchronization signal 572. Furthermore, third control logic block 552 receives a plurality of input signals including: a third high-side diagnostic sensor 506 signal, a third low-side diagnostic sensor 512 signal, an output signal from third sensor 518, an output signal from third PWM 422, and an output signal from third enable signal 428. Third high-side sensor 506 is connected across third high-side switch 526, and is configured to sense voltage, current, voltage difference, or diagnostic faults across the corresponding switch. Similarly, third low-side sensor 512 is connected across third low-side switch 532 and is configured to sense voltage, current, voltage difference, or diagnostic faults across the corresponding switch. One having the ordinary skill in the art will realize that the first high-side diagnostic sensor 502, first low-side diagnostic sensor 508, second high-side diagnostic sensor 504, second low-side diagnostic sensor 510, third high-side diagnostic sensor 506, and the third low-side diagnostic sensor 512 can be connected to the corresponding switches in various ways for sensing voltage, current, voltage difference, or for diagnosing faults.

Still referring to FIGS. 6 and 7, first synchronization signal 568 is connected to the second enable signal 426, and third enable signal 428. Similarly, second synchronization signal 570 connected to first enable signal 424 and third enable signal 428, and third synchronization signal 572 is connected to first enable signal 424 and second enable signal 426. First synchronization signal 568 synchronizes first ASIC 408 with second ASIC 412 and third ASIC 414. Similarly, second synchronization signal 570 synchronizes second ASIC 412 with first ASIC 408 and third ASIC 414, and lastly, third synchronization signal 572 synchronizes third ASIC 414 with first ASIC 408 and second ASIC 412. It should be understood that while the 3-phase programmable load driver module 404 is defined hereinabove as including three ASICs, in certain embodiments, the 3-phase programmable load driver module 404 may only include two ASICs; one of the AISCs may be connected to two high-side switches and two low-side switches, and the other ASIC may be connected to remaining one of the high-side switch and the low-side switch. For example, only one pin of first ASIC 408 carrying first enable signal 424 is used to control timing of one or more injection phases of load 406 (e.g., fuel injector). In another example, as with first ASIC 408, only one pin of second ASIC 412 carrying second enable signal 426 is used to control timing of one or more injection phases of load 406. In yet another example, only one pin of third ASIC 414 carrying third enable signal 428 is used to control timing of one or more injection phases of load 406.

Figure 8:
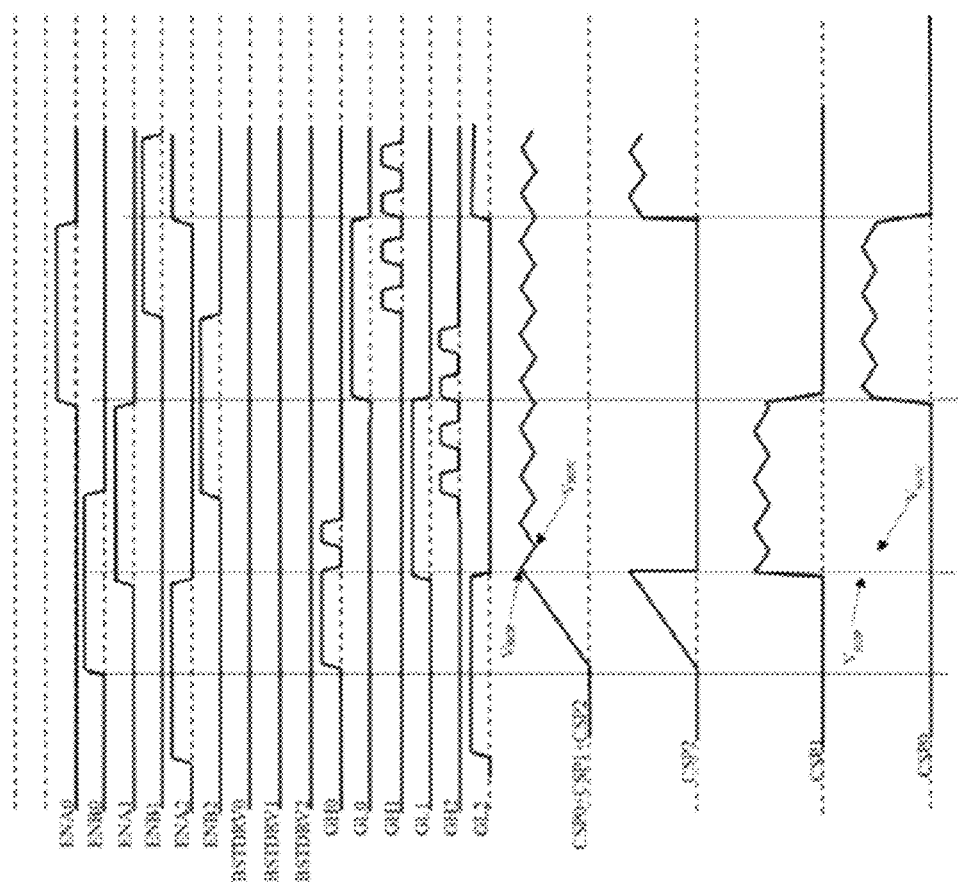
FIG. 8 is a timing diagram depicting operation of the load driver module of FIG. 7.

Operationally, two of the three electrical load windings are energized at one point of time. To energize each of the windings, external current is supplied to the load 406 through 3-phase circuit 410. One end of winding A is connected at a junction of first high-side switch 522 and first low-side switch 528, whereas one end of winding B is connected at a junction of the second high-side switch 524 and second low-side switch 530, and one end of winding C is connected at a junction of third high-side switch 526, and third low-side switch 532. The other end of windings A, B, and C are connected together in a "Y" shape (as shown), or delta shape (not shown). For current to flow into winding A and flow out from winding B, first high-side switch 522 is on and second low-side switch 530 is on, while keeping all other switches off. For current to flow into winding A and flow out from winding C, first high-side switch 522 is on and third low-side switch 532 is on, while keeping all other switches off. For current to flow into winding C and flow out from winding A, third high-side switch 526 is on and first low-side switch 528 is on, while keeping all other switches off. For current to flow into winding C and flow out from winding B, third high-side switch 526 is on and second low-side switches 530 is on, while keeping all other switches off. For current to flow into winding B and flow out from winding C, second high-side switch 524 is on and third low-side switch 532 is on, while keeping all other switches off. For current to flow into winding B and flow out from winding A, second high-side switch 524 is on and first low-side switch 528 is on, while keeping all other switches off. First ASIC 408 has a first high-to-low deadtime, and a first low-to-high deadtime. Similarly, second ASIC 412 has a second high-to-low deadtime, and a second low-to-high deadtime, and third ASIC 414 has a third high-to-low deadtime, and a third low-to-high deadtime. All six deadtimes may be programmable or non-programmable. Additionally, all six deadtimes may have similar dead time duration or different dead time durations. Generally, a deadtime state is a transient state where the ASIC transitions from a high-side on state to a low-side on state or vice versa. FIG. 8 depicts typical operation of system 400 (HS-PWM). As similarly discussed in FIG. 4, for example, enable signals ENA0, ENB0, ENA1, ENB1, ENA2, ENB2 are input control signals. Boost drive signals BSTDRV0, BSTDRV1, BSTDRV2, high-side gate signals GH0, GH1, GH2, and low-side gate signals GL0, GL1, GL2 are output control signals for driving six MOS designated as 522, 524, 526, 528, 530, and 532, as shown in FIG. 6. In one example, the enable signals ENB0, ENB1, and ENB2 can be used as interrupt signals.

Figure 9:
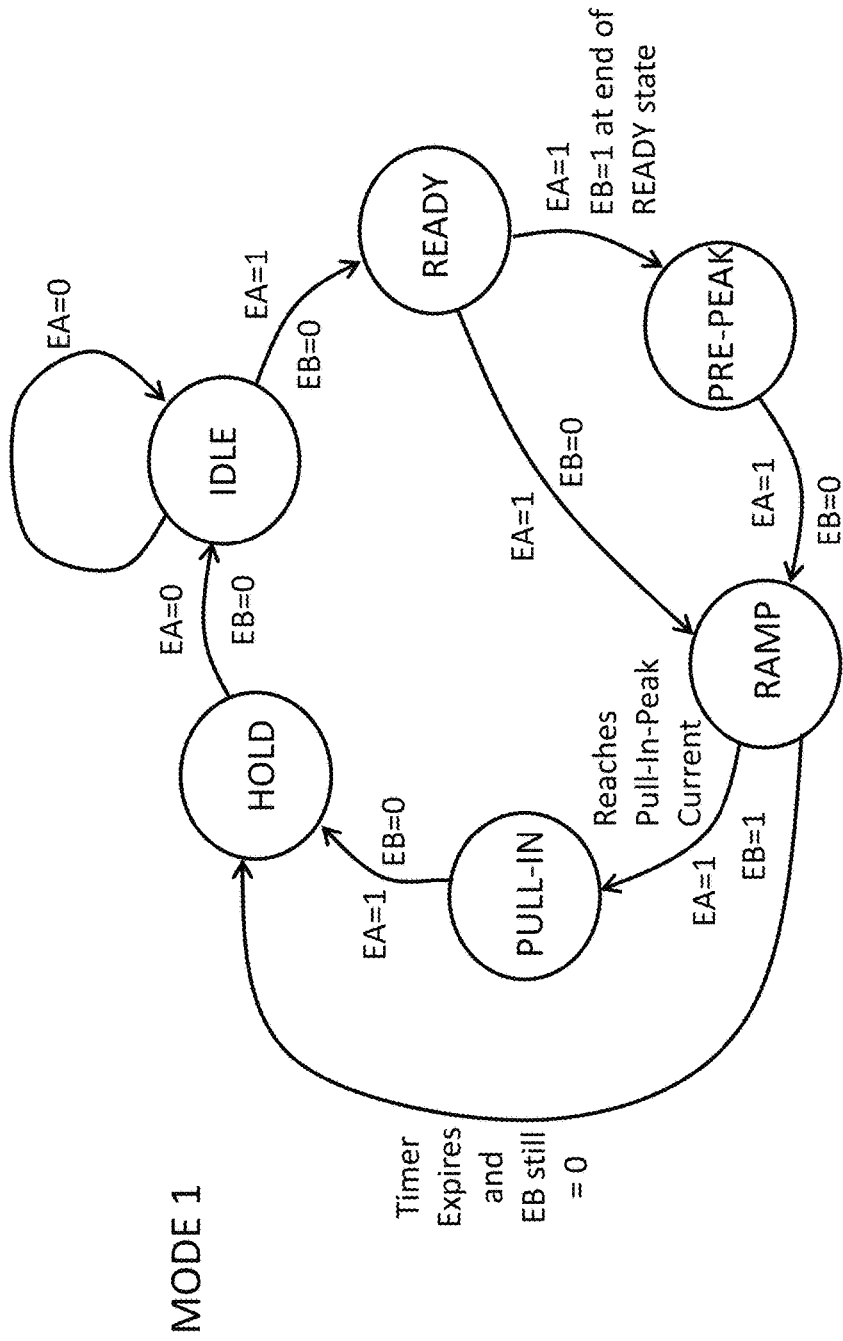
FIGS. 9 and 10 are state machine diagrams of a load driver module according to the present disclosure.

Referring now to FIG. 9, a first mode of operation of the present control scheme ("Mode 1") is depicted in a finite state machine diagram. As shown, in the idle state, EA=0 and EB=0. For example, EA refers to a first enable input control signal and EB refers to a second enable input control signal, and EB signals can be used as interrupt signals. The state machine remains in the idle state until EA=1, when it transitions to the ready state. When EB=1 at the end of the ready state, the state machine transitions to the pre-peak state. When EB=0 at the end of the ready state, the state machine transitions to the ramp state. The state machine also transitions from the pre-peak state to the ramp state when EB=0. When in the ramp state and the timer expires while EB=0, the state machine transitions to the hold state. The state machine transitions to the pull-in state from the ramp state when EB=1 and pull-in peak current is reached. The state machine transitions from the pull-in state to the hold state. Finally, the state machine transitions from the hold state back to the idle state when EA=0.

Figure 10:
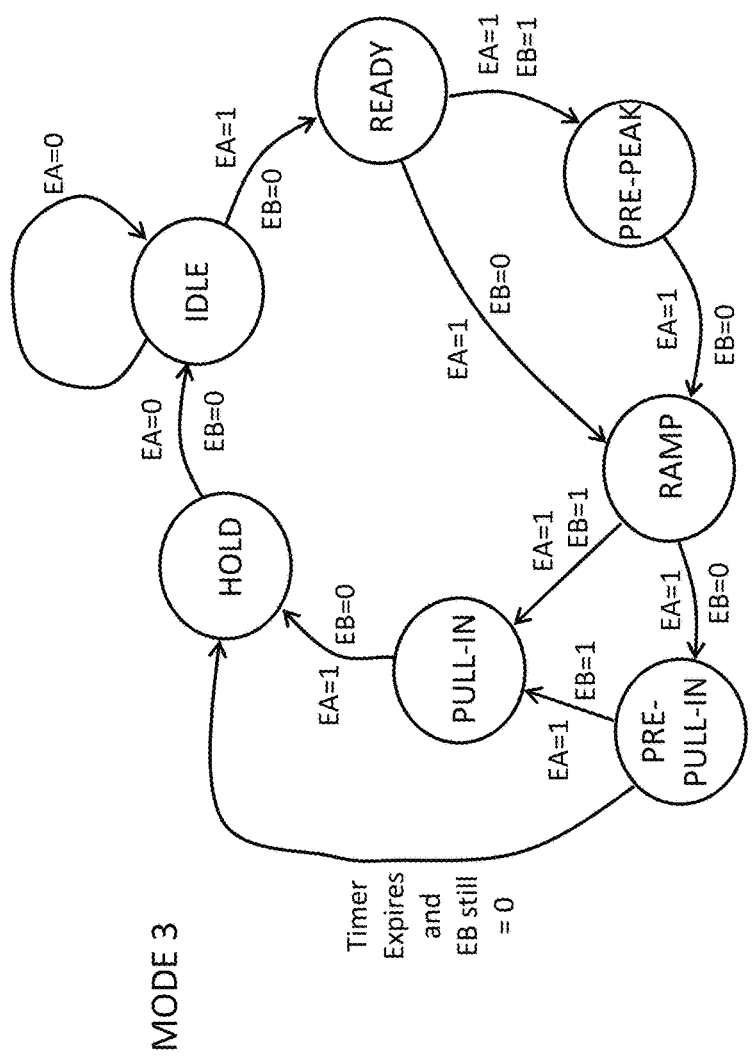

A second mode of operation of the present control scheme ("Mode 3") is depicted in the finite state machine diagram of FIG. 10. The Mode 3 diagram is the same as the Mode 1 diagram of FIG. 9 except that it includes a pre-pull-in state. The state machine transitions from the ramp state to the pre-pull-in state when EA=1 and EB=0. For example, the pre-pull-in state is a boosted pull-in state shown in FIG. 14 where the boost drive signal BSTDRVx is used to increase the pull-in-peak current CSPx (e.g., sensed current signal) faster, wherein x denotes an integer. The state machine transitions from the pre-pull-in state to the hold state when the timer expires and EB still equals zero. The state machine transitions from the pre-pull-in state to the pull-in state when EB=1.

Figure 11:
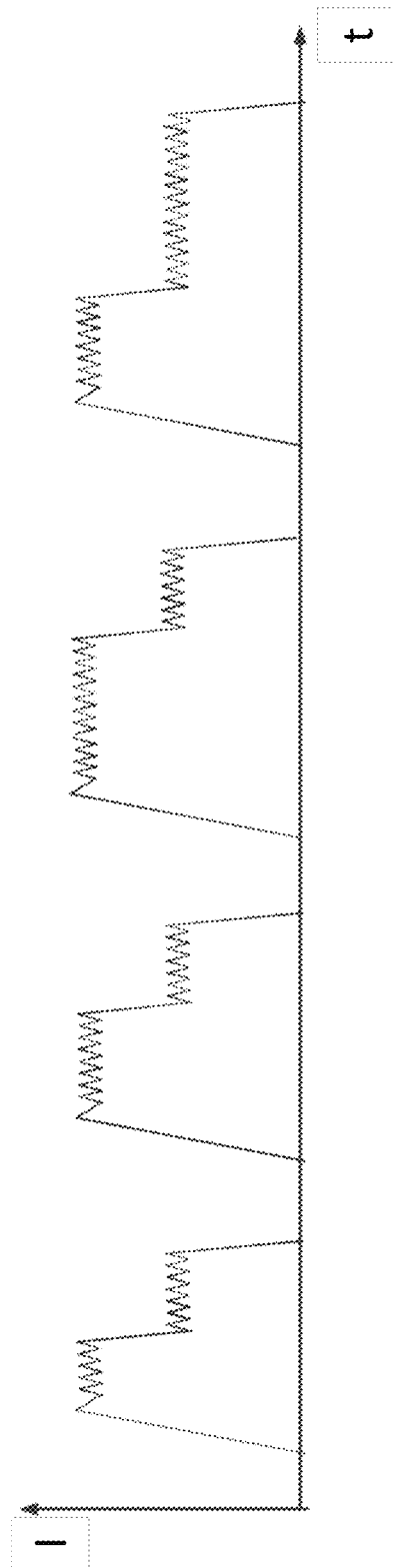
FIG. 11 is a graph of a current waveform with four consecutive injection pulses.

It is desirable to drive signals for pre-defined consecutive injection pulses. In certain embodiments, each pulse may have different timing variables, and up to seven pulses may be used. Driving consecutive injection pulses according to the teachings of the present disclosure accommodates cases where the register writing speed is too low to support consecutive injection pulses in a short timing period. An example of a current waveform with four consecutive pulses having different timing is depicted in FIG. 11.

Figure 12:
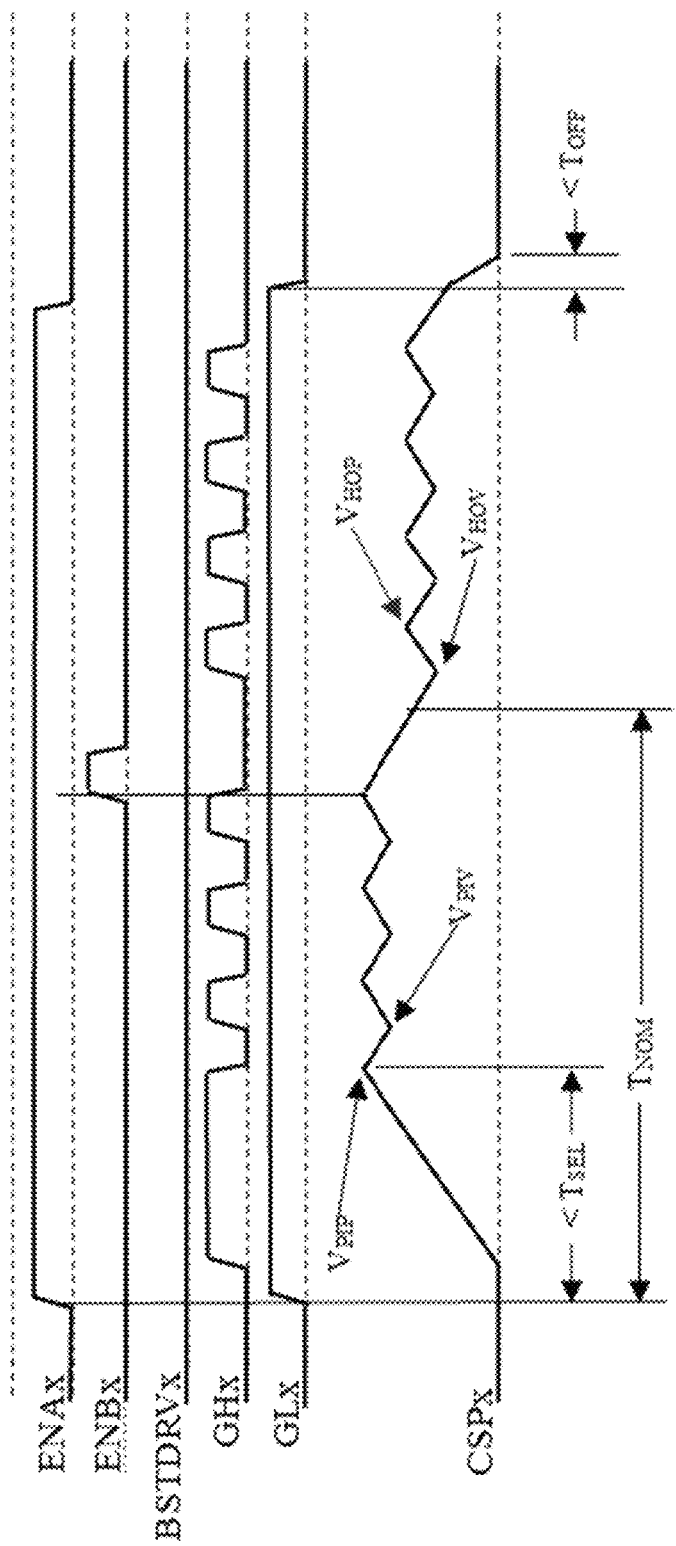
FIGS. 12 and 13 are a timing diagrams depicting a first mode of operation of a load driver module according to the present disclosure.

In both Mode 1 and Mode 3, the pull-in timer can be interrupted and the state machine (see FIGS. 9 and 10) is transitioned from the pull-in state to the hold state upon the occurrence of the interrupt signal. In FIG. 12, a timing diagram is provided wherein the ENBx signal is used as the interrupt signal. This feature permits a highly controllable pull-in time during the injection. As shown, the sensed current signal ("CSPx") transitions from a pull-in-peak voltage to a hold valley voltage at the rising edge of the ENBx signal, which occurs before the nominal time ("$T_{NOM}$") has expired. In this example, $V_{PIP}$ refers to a pull-in-peak voltage level, $V_{PIV}$ refers to a pull-in-valley voltage level, $V_{HOP}$ refers to a hold-peak voltage level, and $V_{HOV}$ refers to a hold-valley voltage level. $T_{SEL}$ refers to a minimum time period during which the current signal CSPx reaches the pull-in-peak voltage level $V_{PIP}$. $T_{OFF}$ refers to a minimum time period during which the current signal CSPx reaches a zero voltage level. $T_{NOM}$ refers to a nominal time period during the pull-in state before reaching the hold state.

Figure 13:
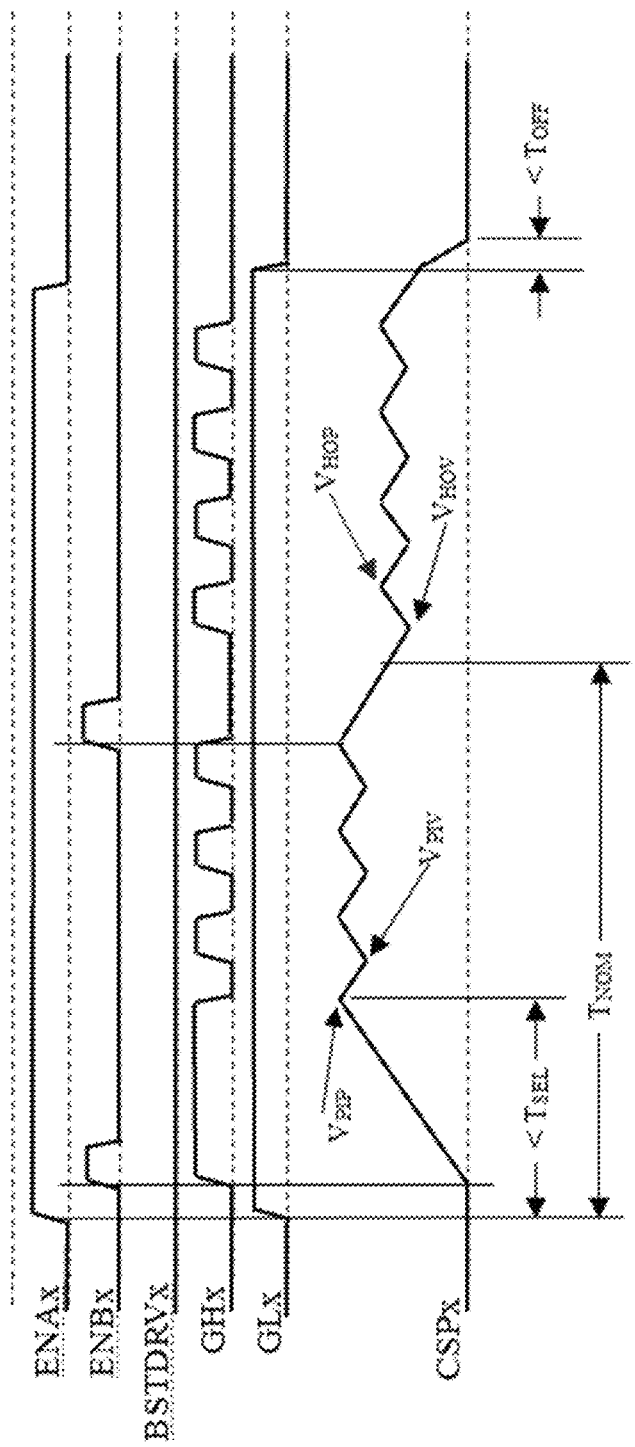

Referring now to FIG. 13, in both Modes 1 and 3, the interrupt control can be used to cause state transitions from the present state to the next state, even if the timer for the state has not expired. Again, in FIG. 13 ENBx is used as the interrupt signal. In the absence of an ENBx interrupt signal, the state transition scheme is the same as normal operation.

Figure 14:
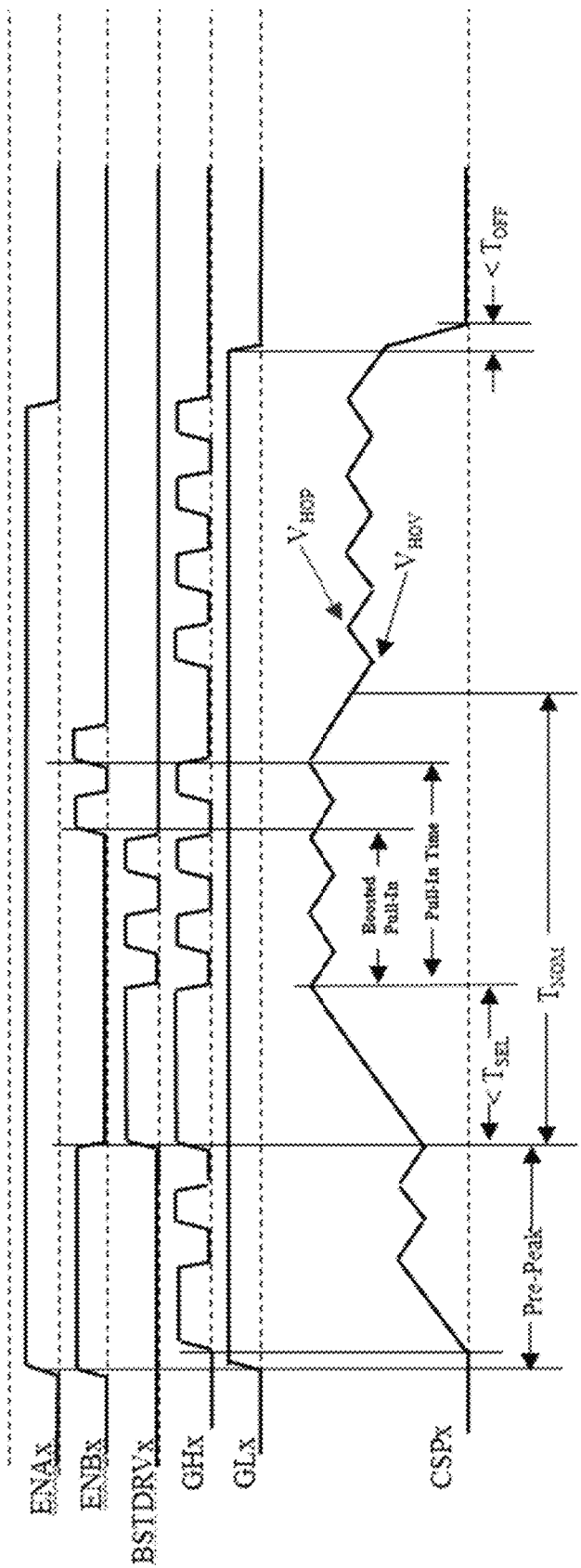
FIG. 14 is a timing diagram depicting a second mode of operation of a load driver module according to the present disclosure.

Referring now to FIG. 14, another example of interrupt control (both Mode 1 and Mode 3) using ENBx is depicted in a timing diagram. When the interrupt control is enabled, the timers can be interrupted by the ENBx signal. The interrupt control only applies to the pre-peak state (pre-peak timer), the boosted pull-in state (boosted pull-in timer) and the pull-in state (pull-in timer). When an interrupt signal is received, the state machine transitions to the next state regardless of whether the timer for the present state has expired. Again, if no interrupt signal occurs, the state machine operates in the normal operation mode. As shown in FIG. 14, the state machine transition for the pre-peak state occurs at the falling edge of ENBx. The state transitions for the boosted pull-in state and the pull-in state occur at the rising edge of ENBx. For the pre-peak state control, when ENAx transitions from low to high, GLx transitions from low to high. If ENBx is high at the time of this transition, then the pre-peak state is enabled. Otherwise, the pre-peak state is skipped for the present injection cycle. In embodiments, the interrupt control signal can be edge-triggered (either rising or falling edge) or level-triggered.

Figure 15:
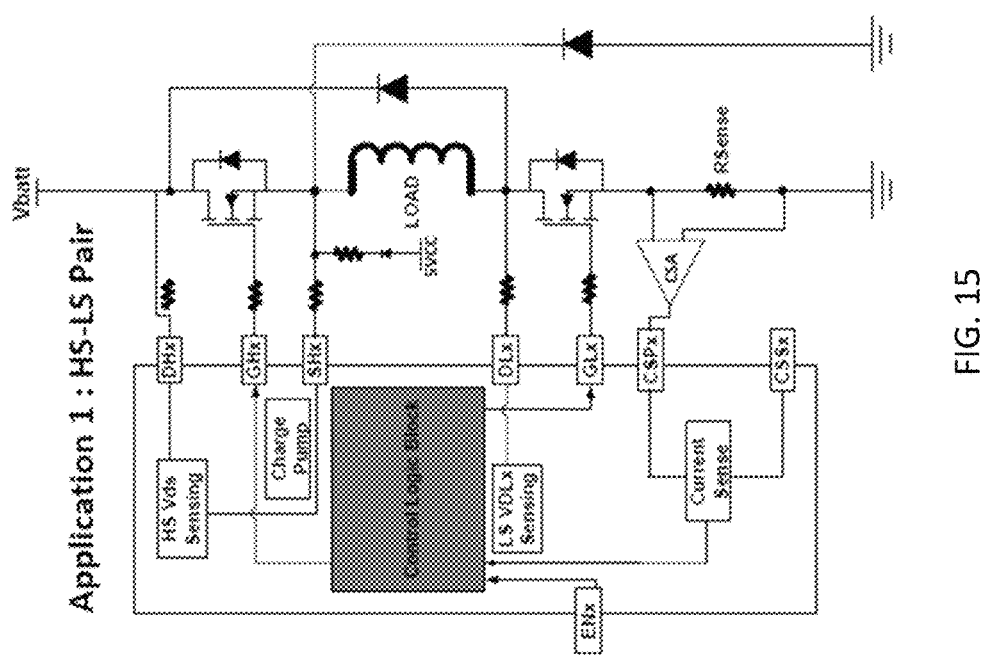
FIG. 15 is a schematic diagram of an application of the present disclosure.
Figure 16:
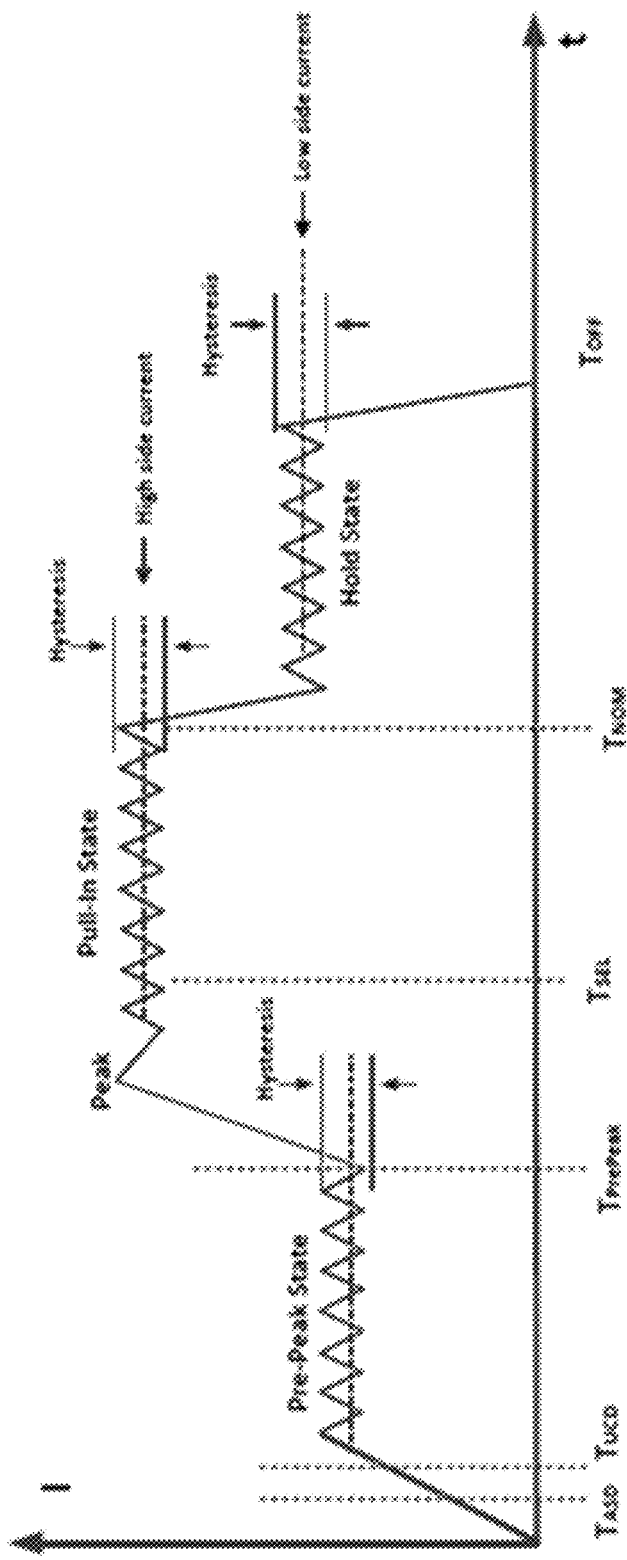
FIG. 16 is a graph of a current waveform generated by the application of FIG. 15.
Figure 17:
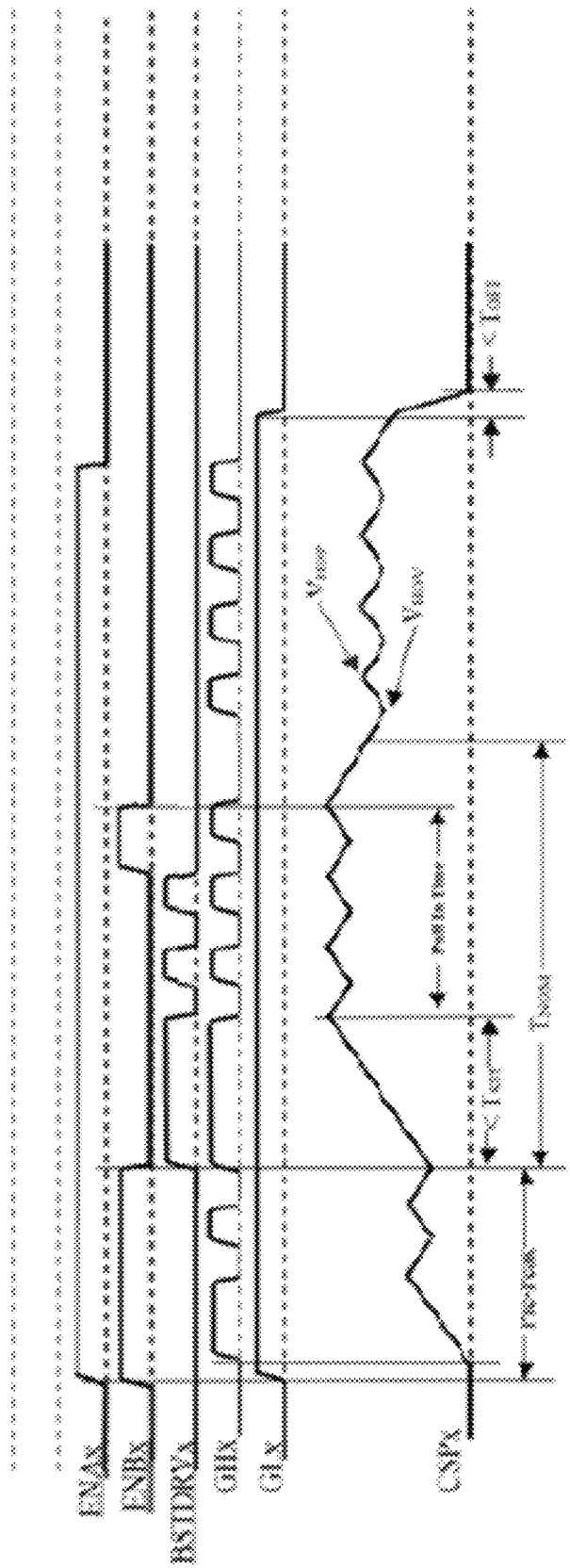
FIG. 17 is a timing diagram depicting operation of the application of FIG. 15.

FIG. 15 depicts a high-side-low-side pair application of the present disclosure for Mode 1. FIG. 16 depicts the corresponding current signal during a single injection cycle, showing transitions from the pre-peak state, to the pull-in state and to the hold state. FIG. 17 provides a timing diagram depicting the current signal as transitions are controlled by ENBx for Mode 3.

Figure 18:
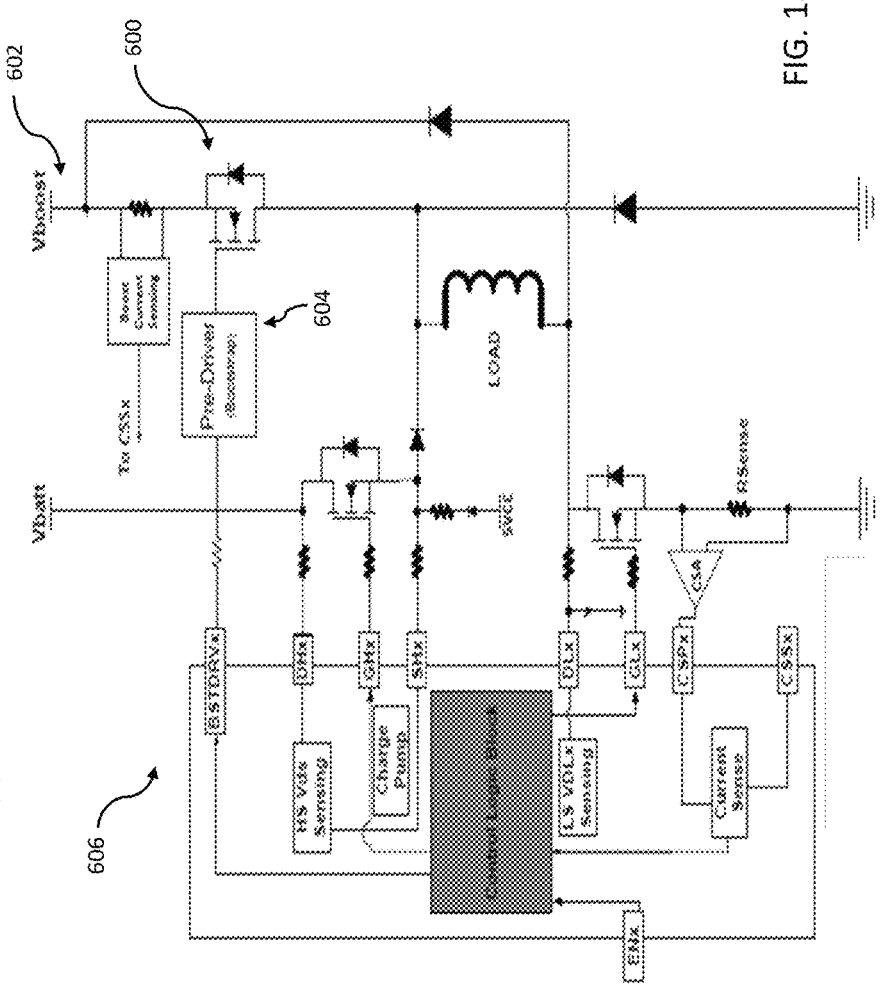
FIG. 18 is a schematic diagram of another application of the present disclosure.
Figure 19:
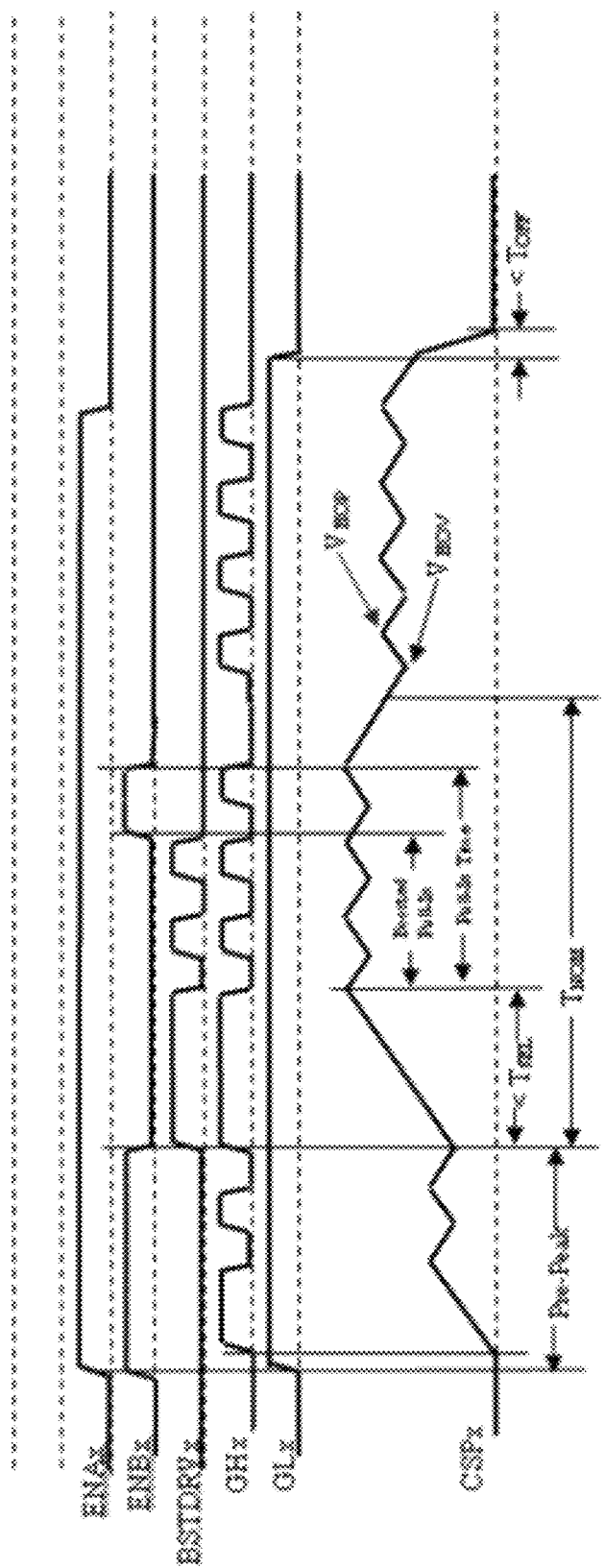
FIG. 19 is a timing diagram depicting operation of the application of FIG. 18.

FIG. 18 depicts a high-side-low-side pair application of the present disclosure with boost for Mode 3. In FIG. 18, a booster switch 600 receives a booster voltage Vboost 602, and a pre-driver (or bootstrap) 604 is configured to generate the boost drive signal BSTDRVx using booster switch 600 and pre-driver 604 is connected between ASIC 606 and booster switch 600. For example, the boost drive signal BSTDRVx has high voltage and is used to increase the pull-in-peak current CSPx. FIG. 19 provides a timing diagram depicting the current signal as transitions between states are controlled by ENBx for Mode 3.

Thus, as described, the present disclosure provides a method for generating the pre-driving signal to drive the fuel injector. The disclosed methods enable on-the-fly timing control (e.g., real time length control) for different injection states or phases, and with a minimum of signal inputs. Also, the present disclosure provides a method for performing an interrupt control using only one pin for on-the-fly (or real time) transition of multiple (e.g., more than three) injection phases.

It should be further understood that, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements. The scope is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B or C may be present in a single embodiment; for example, A and B, A and C, B and C, or A and B and C.

In the detailed description herein, references to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art with the benefit of the present disclosure to affect such feature, structure, or characteristic in connection with other embodiments whether or not explicitly described. After reading the description, it will be apparent to one skilled in the relevant art(s) how to implement the disclosure in alternative embodiments.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f), unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus Various modifications and additions can be made to the exemplary embodiments discussed without departing from the scope of the present disclosure. For example, while the embodiments described above refer to particular features, the scope of this disclosure also includes embodiments having different combinations of features and embodiments that do not include all of the described features. Accordingly, the scope of the present disclosure is intended to embrace all such alternatives, modifications, and variations as fall within the scope of the claims, together with all equivalents thereof.

We claim:

1. A circuit, comprising:
a high-side switch receiving a source voltage;
a low-side switch; and
an application specific integrated circuit (ASIC) connected to the high-side switch and the low-side switch;
wherein the ASIC controls the switches to cause current to flow through a load comprising a fuel injector, thereby controlling timing of a plurality of injection phases of the fuel injector using only one pin of the ASIC.

2. The circuit of claim 1, wherein each of the switches is metal-oxide-semiconductor (MOS).

3. The circuit of claim 1, wherein the ASIC includes a high-side diagnostic sensor connected in parallel across the high-side switch, the high-side diagnostic sensor being configured to diagnose a fault in the high-side switch.

4. The circuit of claim 1, wherein the ASIC includes a low-side diagnostic sensor configured to sense a fault across the low-side switch.

5. The circuit of claim 1, further including a sensor connected between ground and the low-side switch, the sensor being configured to sense a current flowing through the load.

6. The circuit of claim 1, further including a third switch connected between a high side of the load and ground, the third switch being configured to cause current to flow through the load when the high-side switch is off.

7. A circuit, comprising:
a high-side switch receiving a source voltage;
a low-side switch;
a booster switch receiving a booster voltage;
an application specific integrated circuit (ASIC) connected to the high-side switch, the low-side switch and the booster switch;
wherein the ASIC controls the switches to cause current to flow through a load comprising a fuel injector, thereby controlling timing of a plurality of injection phases of the fuel injector using only one pin of the ASIC.

8. The circuit of claim 7, further including a pre-driver connected between the ASIC and the booster switch, the pre-driver being configured to provide high voltage to the booster switch.

9. The circuit in claim 7, wherein each of the switches is metal-oxide-semiconductor (MOS).

10. The circuit of claim 7, wherein the ASIC includes a high-side diagnostic sensor connected in parallel across the high-side switch, the high-side diagnostic sensor being configured to diagnose a fault in the high-side switch.

11. The circuit of claim 7, wherein the ASIC includes a low-side diagnostic sensor configured to sense a fault across the low-side switch.

12. The circuit of claim 7, further including a sensor connected between ground and the low-side switch, the sensor being configured to sense a current flowing through the load.

13. The circuit of claim 7, further including a third switch connected between a high side of the load and ground, the third switch being configured to cause current to flow through the load when the high-side switch is off.

14. A system, comprising:
a control logic module having an output that provides an injection timing signal; and
a programmable load driver module coupled to the control logic module, the programmable load driver module having an input that receives the injection timing signal and being configured to generate an interrupt signal in real time in response to the injection timing signal;
wherein the programmable load driver module provides the interrupt signal to a load to transition the load between a plurality of operating states.

15. The system of claim 14, wherein the programmable load driver module comprises:
a high-side switch receiving a source voltage;
a low-side switch; and
an application-specific integrated circuit (ASIC) connected to the high-side switch and the low-side switch;
wherein the ASIC controls the switches to cause current to flow through the load.

16. The system of claim 14, wherein the programmable load driver module comprises:
a high-side switch receiving a source voltage;
a low-side switch;

a booster switch receiving a booster voltage;

an application specific integrated circuit (ASIC) connected to the high-side switch, the low-side switch, and the booster switch;

wherein the ASIC control the switches to cause current to flow through the load.

17. A method, comprising:

receiving a plurality of injection pulses;

generating a plurality of drive signals in response to the plurality of injection pulses;

generating an interrupt signal in response to the plurality injection pulses, the interrupt signal being one of a high interrupt signal and a low interrupt signal; and transitioning between a plurality of operating states in response to the interrupt signal.

18. The method of claim 17, wherein the interrupt signal has priority over a timer of the plurality of operating states.

19. The method of claim 17, further comprising:

operating an application-specific integrated circuit (ASIC) in response to a low signal at an enable signal input such that a first idle event occurs in which the ASIC is idle;

operating the ASIC in response to a high signal at the enable signal input and a low interrupt signal such that a ready state occurs;

transitioning from the ready state in response to a high interrupt signal and a high signal at the enable signal to cause a pre-peak state to occur;

transitioning from the ready state in response to a first timer signal and a high signal at the enable signal input to cause a ramp state to occur;

transitioning from the pre-peak state in response to a low signal at the interrupt signal and a high signal at the enable signal input to cause the ramp state to occur;

transitioning from the ramp state in response to a second timer signal and a high signal at the enable signal input to cause a booster pull-in state to occur;

transitioning from the ramp state in response to a load reaching a pull-in-peak current and a high interrupt signal to cause a pull-in state to occur;

transitioning from the booster pull-in state in response to a third timer signal and a high signal at the enable signal input to cause a hold state to occur;

transitioning from the booster pull-in state in response to a high interrupt signal and a high signal at the enable signal input;

transitioning from the pull-in state in response to a low interrupt signal and a high signal at the enable signal input; and transitioning from the hold state in response to a low signal at the enable signal input to cause the ASIC to enter an idle state.

20. The method on claim 17, further comprising:

operating an application-specific integrated circuit (ASIC) in response to a low signal at a enable signal input such that a first idle event occurs in which the ASIC is idle;

operating the ASIC in response to a high signal at the enable signal input and a low interrupt signal such that a ready state occurs;

transitioning from the ready state in response to a high interrupt signal and a high signal at the enable signal to cause a pre-peak state to occur;

transitioning from the ready state in response to a first timer signal, a high signal at the enable signal input, and a low interrupt signal to cause a ramp state to occur;

transitioning from the pre-peak state in response to a low interrupt signal and a high signal at the enable signal input to cause the ramp state to occur;

transitioning from the ramp state in response to a high signal at the enable signal input and a high interrupt signal to cause a pull-in state to occur;

transitioning from the ramp state in response to a second timer signal, a high signal to the enable signal input, and a low interrupt signal to cause a hold state to occur;

transitioning from the pull-in state in response to a low interrupt signal and a high signal at the enable signal input; and transitioning from the hold state in response to a low signal at the enable signal input to cause the ASIC to enter an idle state.

21. The method of claim 17, further comprising producing a fault signal in response to a diagnostic signal at one of a high-side switch, a low-side switch, and a current sensor.

* * * * *